United States Patent

Koli

(10) Patent No.: US 10,461,763 B2
(45) Date of Patent: Oct. 29, 2019

(54) DOUBLE DATA RATE TIME INTERPOLATING QUANTIZER WITH REDUCED KICKBACK NOISE

(71) Applicant: Huawei Technologies Co., Ltd., Shenzhen (CN)

(72) Inventor: Kimmo Koli, Helsinki (FI)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/127,871

(22) Filed: Sep. 11, 2018

(65) Prior Publication Data

US 2019/0013817 A1     Jan. 10, 2019

Related U.S. Application Data

(63) Continuation of application No. PCT/EP2017/052021, filed on Jan. 31, 2017.

(51) Int. Cl.
| | |
|---|---|
| H03M 1/08 | (2006.01) |
| H03M 1/36 | (2006.01) |
| H03M 1/00 | (2006.01) |
| H03M 1/44 | (2006.01) |
| H03M 1/46 | (2006.01) |
| H03M 1/20 | (2006.01) |

(52) U.S. Cl.
CPC ......... *H03M 1/0863* (2013.01); *H03M 1/002* (2013.01); *H03M 1/363* (2013.01); *H03M 1/44* (2013.01); *H03M 1/466* (2013.01); *H03M 1/203* (2013.01)

(58) Field of Classification Search
None
See application file for complete search history.

(56) References Cited

U.S. PATENT DOCUMENTS

| | | | |
|---|---|---|---|
| 4,894,557 A | 1/1990 | Beltramini | |
| 4,980,577 A | 12/1990 | Baxter | |
| 5,625,309 A | 4/1997 | Fucili et al. | |
| 6,104,332 A | 8/2000 | Brandt | |
| 7,324,038 B2 * | 1/2008 | van der Goes | .. H03K 17/04106 341/118 |

(Continued)

FOREIGN PATENT DOCUMENTS

| | | | |
|---|---|---|---|
| JP | 2003218698 A | 7/2003 | |
| WO | WO-2018141362 A1 * | 8/2018 | ............ H03M 1/206 |

OTHER PUBLICATIONS

WIPO Written Opinion WO2018141359A, dated Dec. 2017 (Year: 2017).*

(Continued)

*Primary Examiner* — Howard Williams
(74) *Attorney, Agent, or Firm* — Leydig, Voit & Mayer, Ltd.

(57) ABSTRACT

A flash analog to digital converter (ADC) includes a first, second, and third double data rate comparator core configured to determine a relative voltage of a first differential input signal during each of a rising edge and a falling edge in a single clock cycle of a comparator clock input to the comparator core. An inverted comparator clock coupled to the third comparator core reduces kickback noise. The ADC includes a first and a second floating voltage reference configured to shift a voltage of a differential comparator input by a fixed amount, and produce the first and second differential input signal. The third comparator core is cross coupled between the first and second comparator core.

20 Claims, 5 Drawing Sheets

(56) References Cited

U.S. PATENT DOCUMENTS

2014/0361917 A1* 12/2014 Matsuno ............ G01R 19/0038
341/155
2017/0054448 A1* 2/2017 Lye ..................... H03M 1/1245

OTHER PUBLICATIONS

Lin et al., "An Embedded 0.8 V/480 µW 6B/22 MHz Flash ADC in 0.13-µm Digital CMOS Process Using a Nonlinear Double Interpolation Technique" IEEE Journal of Solid-State Circuits, vol. 37, No. 12, XP-001222715, pp. 1610-1617, Institute of Electrical and Electronics Engineers, New York, New York (Dec. 2002).

Kim et al., "A 6-b 4.1-GS/s Flash ADC With Time-Domain Latch Interpolation in 90-nm CMOS," IEEE Journal of Solid-State Circuits, vol. 48, No. 6, XP011510723, pp. 1429-1441, Institute of Electrical and Electronics Engineers, New York, New York (Jun. 2013).

Nagaraj et al., "A Dual-Mode 700-Msamples/s 6-bit 200-Msamples/s 7-bit A/D Converter in a 0.25-µm Digital CMOS Process," IEEE Journal of Solid-State Circuits, vol. 35, No. 12 XP011450371A, pp. 1760-1768, Institute of Electrical and Electronics Engineers, New York, New York (Dec. 2000).

Greeshma et al., "Area Efficient Double Edge Triggered Double Tail Comparator," International Journal of Emerging Technology and Advanced Engineering, vol. 4, No. 4, XP055418201, pp. 61-65 (Apr. 2014).

Tamba et al., "A CMOS 6b 500MSample/s ADC for a Hard Disk Drive Read Channel," IEEE International Solid-State Circuits Conference, ISSCC99 WA18.5, XP032387503, Institute of Electrical and Electronics Engineers, New York, New York (Feb. 17, 1999).

Figueiredo et al., "Kickback Noise Reduction Techniques for CMOS Latched Comparators," IEEE Transactions on Circuits and Systems—II: Express Briefs, vol. 53, No. 7, pp. 541-545, Institute of Electrical and Electronics Engineers, New York, New York (Jul. 2006).

* cited by examiner

DOUBLE DATA RATE TIME INTERPOLATING QUANTIZER WITH REDUCED KICKBACK NOISE

CROSS-REFERENCE TO RELATED APPLICATIONS

This application is a continuation of International Application No. PCT/EP2017/052021, filed on Jan. 31, 2017, the disclosure of which is hereby incorporated by reference in its entirety.

TECHNICAL FIELD

The aspects of the disclosed embodiments relate generally to analog to digital conversion in wireless communication devices and in particular to flash type analog to digital conversion apparatus.

BACKGROUND

Modern mobile communication devices such as those based on 5G wireless networks require energy efficient wide bandwidth analog to digital converters (ADCs) to support processing of received radio signals. The fastest type of ADC are based on an architecture referred to as direct conversion or flash ADC. Direct conversion or flash ADC is preferred for wireless and mobile device applications because of the fast conversion times that can be achieved. A flash ADC uses a separate reference voltage and comparator for each quantization level resulting in $2^N-1$ reference voltages and comparators for an N bit ADC.

Sampling noise from multiple comparators can leak back onto the input voltage and/or reference voltages distorting the input and reference signals. This noise leakage, referred to as kickback noise, can significantly deteriorate the accuracy of a flash ADC.

Reference voltages may be created using a resistor string to divide a single voltage source. Preamplifiers are often inserted before each comparator to help prevent kickback noise from distorting the input and reference voltages. However, preamplifiers increase power consumption and can significantly reduce the battery life of a mobile communication devices. The preamplifiers also increase complexity and area of the ADC.

Power consumption of flash ADCs can be reduced by using floating voltage sources to provide the reference voltages. One approach to creating a floating voltage source is to use a switched capacitor network to shift the input voltage up or down by a predetermined amount. With this method no additional preamplifier stages are required and fully differential inputs are easy to implement. However, kickback transients from the comparators are not isolated and can significantly distort the input signal.

SUMMARY

Thus there is a need for improved methods and apparatus to convert analog signals to digital signals that can satisfy the speed requirements of mobile communication devices and can also provide low power consumption and accurate linear analog to digital conversion. Accordingly, it would be desirable to provide methods and apparatus that addresses at least some of the problems identified above.

It is an object of the disclosed embodiments to provide an improved concept for converting analog to digital signals in mobile communication devices. This problem is solved by the aspects of the disclosed embodiments. The improved analog to digital conversion provides reduced kickback noise resulting in improved conversion accuracy while reducing power consumption. Further advantages and modifications can be found in the dependent claims.

According to a first aspect the above and further objects and advantages are obtained by an apparatus that includes a first double data rate comparator core configured to determine a relative voltage of a first differential input signal during each of a rising edge and a falling edge in a single clock cycle of a comparator clock input to the first comparator core. The apparatus also includes a second double data rate comparator core configured to determine a relative voltage of a second differential input signal during each of the rising edge and the falling edge in the single clock cycle of the comparator clock input to the second comparator core, and a third double data rate comparator core configured to determine a relative voltage of a third differential input signal during each of a rising edge and a falling edge in the single clock cycle of an inverted comparator clock input to the third comparator core. The apparatus includes a first floating voltage reference configured to shift a voltage of a differential comparator input signal by a first fixed amount, and produce the first differential input signal, and a second floating voltage reference configured to shift the differential comparator input signal by a second fixed amount and produce the second differential input signal, and a clock inverter circuit connected to the comparator clock signal and configured to produce the inverted comparator clock signal. The third differential input signal is cross connected to the first differential input signal and the second differential input signal. The aspects of the disclosed embodiments reduce the kickback noise generated by the comparator cores while keeping power consumption low.

In a first possible implementation form of the apparatus according to the first aspect the apparatus further includes a first double data rate set-reset flip flop circuit, where the first double data rate set-reset flip flop circuit has a set input and a reset input configured to be connected to respective outputs of the first double data rate comparator core; a second double data rate set-reset flip flop circuit, the second double data rate set-reset flip flop circuit including a set input and a reset input configured to be connected to respective outputs of the second double data rate comparator core; and a third double data rate set-reset flip flop circuit, the third double data rate set-reset flip flop circuit including a set input and a reset input configured to be connected to respective outputs of the third double data rate comparator core. The first double data rate set-reset flip flop circuit, the second double data rate set-reset flip flop circuit and the third double data rate set-reset flip flop circuit are configured to perform a set-reset operation during the rising edge and the falling edge in a single clock cycle. The comparator of the disclosed embodiments operates on both edges of the clock which leads to modification also in the time-based interpolation circuitry and output set-reset flip-flops. This allows for lower area, lower power consumption, and reduced sensitivity to variations in environment and manufacturing process.

In a second possible implementation form of the apparatus according to the first aspect as such or according to the first possible implementation form of the first aspect at least one of the first, second, and third double data rate set-reset flip flop circuits is coupled to a corresponding one of the first comparator core and the second comparator core through a respective one of a first pair of inverter circuits or a second pair of inverter circuits. Each one of the inverter circuits is configured to invert and delay a respective one of the outputs of the first comparator core and the outputs of the second comparator core. The delay of each one of the inverter circuits matches a delay of the clock inverter circuit.

In a third possible implementation form of the apparatus according to the first aspect as such or according to the first or second possible implementation forms of the first aspect at least one of the first floating voltage reference and the second floating voltage reference include a switched capacitor network. The switched capacitor network includes a first capacitor connected in series between an input and an output of the floating voltage reference, a second capacitor, and a CMOS switching network configured to alternately connect the second capacitor to a reference voltage and in parallel to the first capacitor. The switched capacitor network eliminates the need for preamplifiers, thereby reducing power consumption, while providing easy implementation of fully differential inputs.

In a fourth possible implementation form of the apparatus according to the first aspect as such or according to any of the first through third possible implementation forms of the first aspect at least one of the first double data rate comparator core, the second double data rate comparator core, and the third double data rate comparator core includes a PMOS differential amplifier stage and an NMOS differential amplifier stage connected together in a push-pull configuration. The push pull configuration allows double data rate operation of the comparator core.

In a fifth possible implementation form of the apparatus according to the first aspect as such or according to any of the first through fourth possible implementation forms of the first aspect prior to the rising edge in the single clock cycle a voltage at a first node connecting a first drain of the PMOS differential amplifier stage to a first drain of the NMOS differential amplifier stage and a voltage at a second node connecting a second drain of the PMOS differential amplifier stage to a second drain of the NMOS differential amplifier stage is charged towards a positive supply voltage. During the rising edge in the single clock cycle, the voltage at the first node and the voltage at the second node are discharged towards a negative supply voltage, and during the falling edge in the single clock cycle the voltage at the first node and the voltage at the second node are charged towards the positive supply voltage. Operating on both the rising and falling edge of the clock provides double data rate operation of the comparator core.

In a sixth possible implementation form of the apparatus according to the first aspect as such or according to any of the first through fifth possible implementation forms of the first aspect a plus comparator core output of the comparator core is produced by a CMOS inverter connected to the first node, and a minus comparator core output of the comparator core is produced by a second CMOS inverter connected to the second node. A timing of the plus comparator core output and the minus comparator core output is proportional to a voltage difference between the input signal and the reference signal. This configuration provides a proportional conversion of the voltage difference to a delay time.

In a seventh possible implementation form of the apparatus according to the first aspect as such or according to any of the first through sixth possible implementation forms of the first aspect at least one of the first double data rate set-reset flip flop circuit, the second double data rate set-reset flip flop circuit, and the third double data rate set-reset flip flop circuit includes a first SR latch circuit configured to be connected in parallel with a second SR latch circuit; a third SR latch circuit; and a switching device. The switching device is configured to selectively connect outputs of the first SR latch circuit or outputs of the second SR latch circuit to respective inputs of the third SR latch circuit. The apparatus further includes a controller configured to control the switching device to switch between output and outputs when a state of a signal on the set input and a state of a signal on the reset input to the set-reset circuit are equal. This ensures the outputs of the double data rate SR flip flop circuit are not connected to an unstable SR latch.

In an eighth possible implementation form of the apparatus according to the first aspect as such or according to any of the first through seventh possible implementation forms of the first aspect a set input and a reset input of the first SR latch circuit are configured to be connected through a pair of inverter circuits to the respective Outputs of the first double data rate comparator core. A set input and a reset input of the second SR latch circuit are configured to be connected to inverted forms of the respective set input and reset input of the first double data rate comparator core. Providing inverted inputs to one SR latch and non-inverted inputs to the other ensure at least one of the SR latches will have stable outputs at any point in time.

In a ninth possible implementation form of the apparatus according to the first aspect as such or according to any of the first through eighth possible implementation forms of the first aspect the first input of the first SR latch circuit is configured to be connected to the set input of the first double data rate set-reset circuit, the second input of the first SR latch circuit is configured to be connected to the reset input of the first double data rate set-reset circuit, the first input of the second SR latch circuit is configured to be connected to an output of an inverter connected between the set input and the first input, the second input of the second SR latch circuit is configured to be connected to an output of an inverter connected between the reset input and the second input, and the switching device is configured to selectively connect the first input of the third SR latch circuit and the second input of the third SR latch circuit to the respective first and second outputs of the first SR latch circuit and the first and second outputs of the second SR latch circuit. This configuration ensures the output of the double data rate SR flip flop is never in an unstable state.

In a tenth possible implementation form of the apparatus according to the first aspect as such or to any of the seventh through ninth possible implementation forms of the first aspect the controller has a first input configured to be connected to the set input of the first double data rate set-reset circuit, a second input configured to be connected to the reset input of the first double data rate set-reset circuit and an output configured to be connected to a switching control input of the switching device. Coupling the controller to the set and reset inputs of the double data rate set-reset circuit allows the controller to select the desired SR latch based on inputs to the SR latches thereby avoiding an unstable output condition.

According to a second aspect the above and further objects and advantages are obtained by a radio receiver that includes the apparatus according to first aspect as such or to any one of the first through eleventh possible implementation forms of the first aspect.

BRIEF DESCRIPTION OF THE DRAWINGS

In the following detailed description, the disclosure will be explained in more detail with reference to the example embodiments shown in the drawings, in which.

DETAILED DESCRIPTION OF THE DISCLOSED EMBODIMENTS

Figure 1:
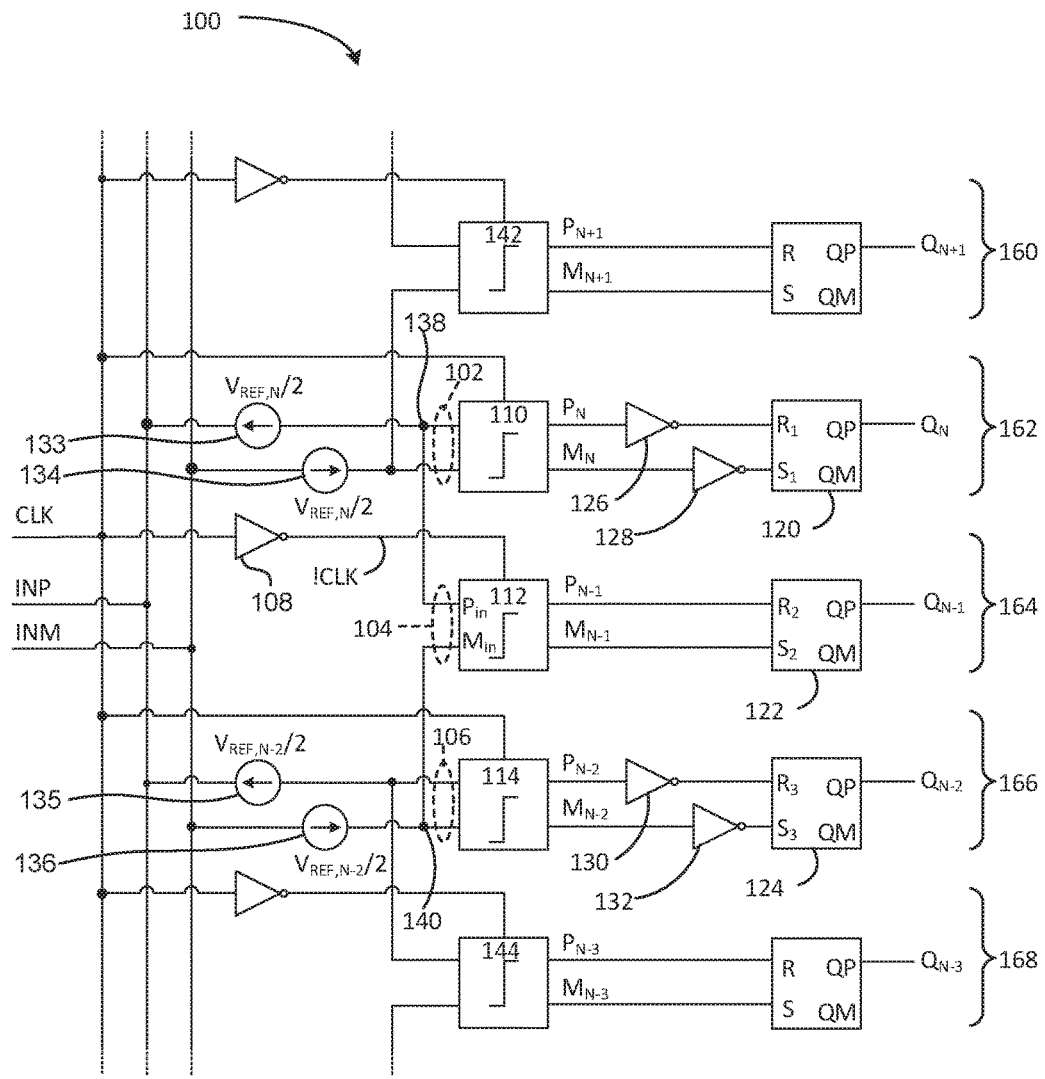
FIG. 1 illustrates a schematic diagram depicting an exemplary flash ADC architecture incorporating aspects of the disclosed embodiments.

FIG. 1 illustrates a schematic diagram of an exemplary architecture for a flash ADC 100 incorporating aspects of the disclosed embodiments. The aspects of the disclosed embodiments are directed to a flash ADC that reduces the kickback noise generated by the comparator cores while keeping power consumption low.

In the example of FIG. 1, the flash ADC 100, also referred to herein as apparatus 100, includes a first double data rate comparator core 110, a second double data rate comparator core 114 and a third double data rate comparator core 112. The first double data rate comparator core 110 is configured to determine a relative voltage of a first differential input signal 102 during each of a rising edge and a falling edge in a single clock cycle of a comparator clock CLK input to the first comparator core 110. The second double data rate comparator core 114 is configured to determine a relative voltage of a second differential input signal 106 during each of the rising edge and the falling edge in the single clock cycle of the comparator clock CLK input to the second comparator core 114. The third double data rate comparator core 112 is configured to determine a relative voltage of a third differential input signal 104 during each of a rising edge and a falling edge in the single clock cycle of an inverted comparator clock (!CLK) input to the third comparator core 112. The third differential input signal 104 is cross connected to the first differential input signal 102 and the second differential input signal 106.

In an embodiment, a first floating voltage reference 133, 134 is configured to shift a voltage of a differential comparator input signal (defined by signals INP, INM) by a first fixed amount, and produce the first differential input signal 102, a second floating voltage reference 135, 136 is configured to shift the differential comparator input signal by a second fixed amount and produce the second differential input signal 106. A clock inverter circuit 108 is connected to the comparator clock signal and configured to produce the inverted comparator clock signal (!CLK).

The exemplary flash ADC architecture 100 of the disclosed embodiments reduces the number of reference voltage generators 133, 134, 135, 136 by cross coupling every second comparator core 142, 112, 144 to inputs of adjacent comparator cores 110, 114. In this way the number of reference voltage generators 133-134, 135-136 may be reduced by half. The flash ADC architecture 100 will be described in detail below based on three quantization circuits 162, 164, 166. Additional quantization circuits 160 and 168 producing output $Q_{N+1}$ and $Q_{N-3}$ are included in FIG. 1 only as an illustration of how the flash ADC architecture 100 can be extended to generate any desired number of quantization outputs.

Each quantization circuit 162, 164, 166 includes a respective double data rate comparator core 110, 112, 114 followed by a double data rate set-reset flip-flop circuit 120, 122, 124. The double data rate comparator cores 110, 112, 114, generally referred to herein as a comparator core, are configured to sample a differential input signal 102, 104, 106 on each of a rising edge and a falling edge of a clock signal CLK. The double data rate set-reset flip flops 120, 122, 124, generally referred to herein as an SR flip-flop, are configured to determine their clock information from the respective set input signals S and reset input signals R and do not receive a clock signal directly. The SR flip flops 120, 122, 124 may therefore be described as being clock-less.

The comparator cores 110, 114 receive a differential input voltage 102, 106 produced by a floating reference voltage generator 133-134, 135-136. Each floating reference voltage generator 133-134, 135-136 is coupled to the ADC input signals INP, INM, and is configured to shift the input signals INP and INM down or up respectively by a pre-determined voltage: $V_{REF,N}/2$ for floating reference voltage generator 133-134, and $V_{REF,N-2}/2$ for floating reference voltage generator 135-136. The resulting shifted voltage signal 102, 106 is then applied to the corresponding comparator core 110, 114.

To reduce the number of floating voltage generators required by a conventional flash ADC, comparator cores, such as comparator core 112, do not have a corresponding reference voltage generator and are instead cross coupled to the input signals 102, 106 of the adjacent comparator cores 110, 114. Reducing the number of reference voltage generators in this fashion has the advantage of reducing power consumption and as will be discussed further below, may also be configured to cancel and recycle kickback currents created by the comparator cores.

Cross coupling for the third differential input signal 104 is achieved by connecting the plus input $P_{in}$ of the comparator core 112 to the plus differential input 138 of the next comparator core 110 and the minus input $M_{in}$ of the comparator core 112 to the minus differential input 140 of the prior comparator core 114. As used herein the next comparator core 110 has a reference voltage $V_{REF,N}$ that is greater than the reference voltage $V_{REF,N-2}$ of the prior comparator core 112. The illustrated cross coupling configuration results in creating an effective reference voltage for the cross coupled comparator core 112 that is the average of the reference voltages $V_{REF,N}$, $V_{REF,N-2}$ to which it is cross coupled. The same principle can accordingly applied for other differential input signals which are based on mentioned cross coupling (such as the differential input signals for the comparator cores 142, 144).

The double data rate comparator cores 110, 112, 114 are configured to perform comparisons on both the rising clock edge and the falling clock edge. As will be described further below, each comparator core 110, 112, 114 compares its input signal with an NMOS differential amplifier stage on the rising clock edges and with a PMOS differential amplifier stage on the falling clock edges, resulting in kickback transient currents on the differential inputs 102, 104, 106 having opposite direction for rising and falling clock edges. The kickback current is generated by the gate-source capacitances of the input NMOS and PMOS differential pairs.

When using floating voltage generators 133-134, 135-136 as illustrated in the ADC architecture 100, the kickback noise can become very large. Conventional ADC architectures use input amplifiers to reduce the kickback noise. However input amplifiers need to be very fast and need to have low output impedance resulting in complexity and increased power consumption. Alternatively, comparator input sizes can be reduced. However this leads to increased offset voltages in the comparators resulting in nonlinearities in the analog to digital conversion.

The double data rate comparators cores 110, 112, 114 have capability to perform comparisons on both the rising and falling edges of the clock signal CLK. The novel flash ADC architecture 100 takes advantage of this capability to cancel out the kickback current transients and to recycle the current transients as bias current for the neighboring comparator cores resulting in a significant reduction of kickback noise and power consumption. To achieve this advantage, an inverter 108 is used to create an inverted clock signal !CLK which is used to drive the cross coupled comparator core 112. The cross coupled comparator core 112 is then performing its comparison with an NMOS differential amplifier stage while the neighboring comparator cores 110, 114 to which the cross coupled comparator core 112 is connected at nodes 138, 140, are performing their comparison with a PMOS differential amplified stage. This situation reverses on the other clock edge. Thus, the comparator cores 110, 112 driven with the non-inverted clock signal CLK work together with the cross coupled comparator core 112 driven with the inverter clock signal !CLK to cancel and recycle the kickback currents.

In certain embodiments it may be desirable to perform time-based interpolation or other time-based operations on the outputs of the comparator cores 110, 112, 114. In these embodiments it may be advantageous to include inverters 126, 128, 130, 132 following the comparator cores 110, 114 that are operating on the non-inverted clock signal CLK in order to match the time-delay created when inverting the clock signal with the inverter 108.

In the exemplary flash ADC architecture 100 the reference voltages 133-134, 135-136 are provided by coupling a floating reference voltage generator 133-134, 135-136 in each leg of the differential inputs 102, 106 between the ADC input signal INP, INM and the comparator cores 110, 114. Each floating reference voltage generator 133-134, 135-136 includes a pair of voltage sources 133-134, 135-136. One voltage source 133, 135 in each pair is configured to shift the plus input signal INP down by half of a pre-determined reference voltage $V_{REF,N}/2$, $V_{REF,N-2}/2$ and the other voltage source 134, 136 is configured to shift the minus input signal INM up by half of a pre-determined reference voltage $V_{REF,N}/2$, $V_{REF,N-2}/2$. Those skilled in the art will readily recognize that any type of reference voltage generator may be advantageously employed without straying from the spirit and scope of the present disclosure.

Figure 2:
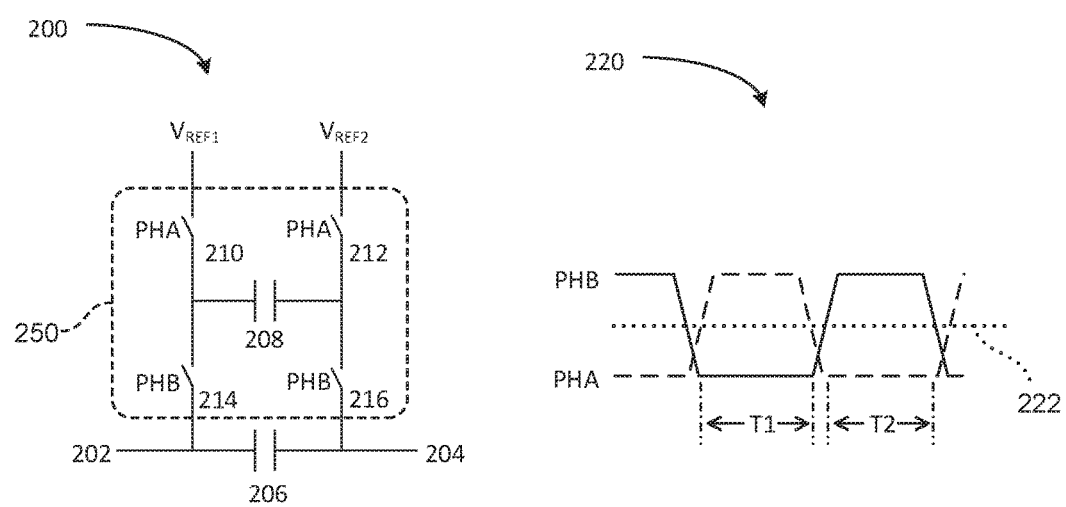
FIG. 2 illustrates a schematic diagram and associated waveforms for an exemplary floating voltage reference incorporating aspects of the disclosed embodiments.

FIG. 2 illustrates a schematic diagram of an exemplary switched capacitor network 250 appropriate for creating a floating voltage reference 200 incorporating aspects of the disclosed embodiments. Like drive signal labels PHA, PHB indicate which switches 210, 212, 214, 216 are driven by each drive signal PHA, PHB. Exemplary switch drive waveforms configured to drive the switched capacitor network 200 are illustrated in the accompanying graph 220. The floating reference voltage generator 200 is appropriate for use as any of the floating voltage generators 133, 134, 135, 136 employed in the exemplary flash ADC architecture 100 illustrated in FIG. 1 and described above.

The floating reference voltage generator 200 receives a reference voltage across input terminals $V_{REF1}$, $V_{REF2}$. A capacitor 206 is connected in series between an input signal 202 and an output signal 204 with a second capacitor 208 configured to be selectively coupled in parallel with the first capacitor 206 or coupled to the input voltage $V_{REF1}$, $V_{REF2}$. A switching network, including four switches 210, 212, 214, 216, is configured to provide the selective coupling of the capacitor 208. Any appropriate type of semiconductor switch may be used for the switches 210, 212, 214, 216.

In operation switching signals, such as the switching signals illustrated in graph 220, are applied to the switches 210, 212, 214, 216. The switching signal PHA is applied to one pair of switches 210, 212, and the switching signal PHB is applied to the second pair of switches 214, 216. The switching signals PHA, PHB are configured to avoid overlap which means that one pair of switches is turned off before the second pair of switches is turned on. The graph 220 includes a turn-on threshold 222 illustrating how one switching signal PHA falls below the turn-on threshold 222 thereby turning off the associated switches 210, 212 before the other switching signal PHB rises above the turn-on threshold 222 thereby turning on the associated switches 214, 216 to create non-overlapping operation. In this fashion the switching signals PHA, PHB are configured to ensure only one pair PHA or PHB of switches is on at any time.

During a first time T1 switches 210 and 212 are turned on and the first capacitor 208 is charged to the reference voltage $V_{REF1}$, $V_{REF2}$. During a second time period T2 the first pair of switches 210, 212 are turned off and the second pair of switches 214, 216 are turned on thereby charging the second capacitor 206 with the charge from the first capacitor 208. In embodiments where the two capacitors 208, 206 have equal value or size, the voltage created on the second capacitor 206 is half of the reference voltage $V_{REF1}$, $V_{REF2}$.

Figure 3:
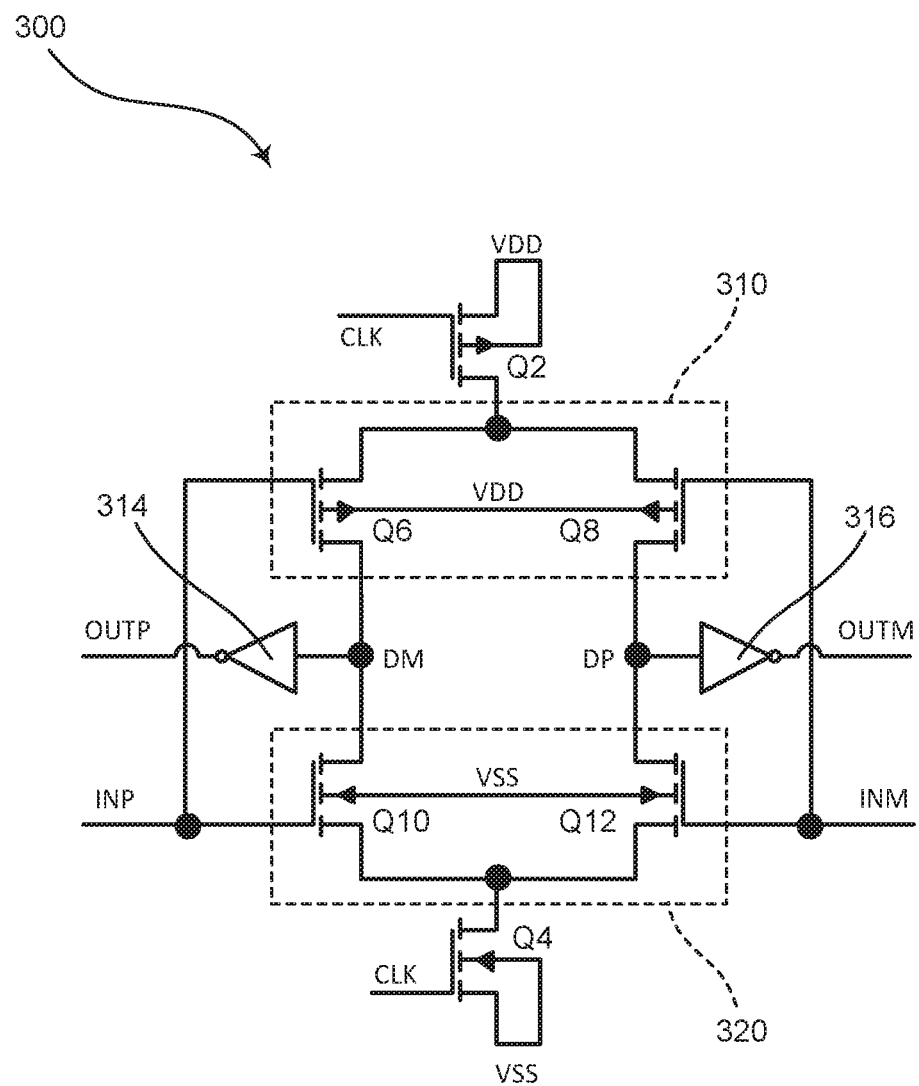
FIG. 3 illustrates a schematic diagram of an exemplary double data rate comparator core incorporating aspects of the disclosed embodiments.

FIG. 3 illustrates a schematic diagram of a double data rate comparator core 300 appropriate for use as any of the comparator cores 110, 112, 114 employed in the flash ADC architecture 100 shown in FIG. 1. In this example, the double data rate comparator core 300 is constructed of a PMOS differential amplifier stage 310 having a pair of PMOS transistors Q6, Q8, and an NMOS differential amplifier stage 320 having a pair of NMOS transistors Q10, Q12. The embodiment of FIG. 3 shows the PMOS differential amplifier stage 310 and the NMOS differential amplifier stage 320 connected together in a push-pull configuration. The push pull configuration provides a comparison operation on both the rising edge and the falling edge of the clock signal CLK.

In one embodiment the double data rate comparator core 300 includes a first node (DM) connecting a first drain of the PMOS differential amplifier stage 310 to a first drain of the NMOS differential amplifier stage 320 and a second node DP connecting a second drain of the PMOS differential amplifier stage 310 to a second drain of the NMOS differential amplifier stage 320. Prior to the rising edge in the single clock cycle a voltage at the first node DM and a voltage at the second node DP is charged towards a positive supply voltage VDD. During the rising edge in the single clock cycle, the voltage at the first node DM and the voltage at the second node DP is discharged towards a negative supply voltage VSS. During the falling edge in the single clock cycle the voltage at the first node DM and the voltage at the second node DP is charged towards the positive supply voltage VDD.

As noted above, before the rising clock edge, the PMOS differential stage 310 has pulled the nodes DP and DM almost to the positive supply voltage VDD. A small residual voltage difference proportional to input voltage difference will remain. In the case of a large differential input, the comparison is unaffected by this unbalance. In the case of a small differential input, the very small residual voltage imbalance becomes insignificant to the comparison accuracy.

During the rising edge of the clock CLK, nodes DP and DM are discharged towards the negative supply voltage VSS with a rate controlled by input differential voltage. Around the inverter tipping point (approximately half of the supply voltage) both differential amplifier stages 310, 320 contribute to the discharging current difference thus maximizing the voltage-to-time conversion. This also means that the input offset voltage of the double data rate comparator core 300 is the average of the two differential pair offsets.

During the falling edge of the clock CLK, nodes DP and DM are charged towards the positive supply voltage VDD with a rate controlled by input differential voltage resulting again into voltage-to-time conversion. The balance between delay differences between rising and falling clock edges are mainly set by the on-resistance of switch transistors Q2, Q4 connected to the differential pair sources.

Figure 4:
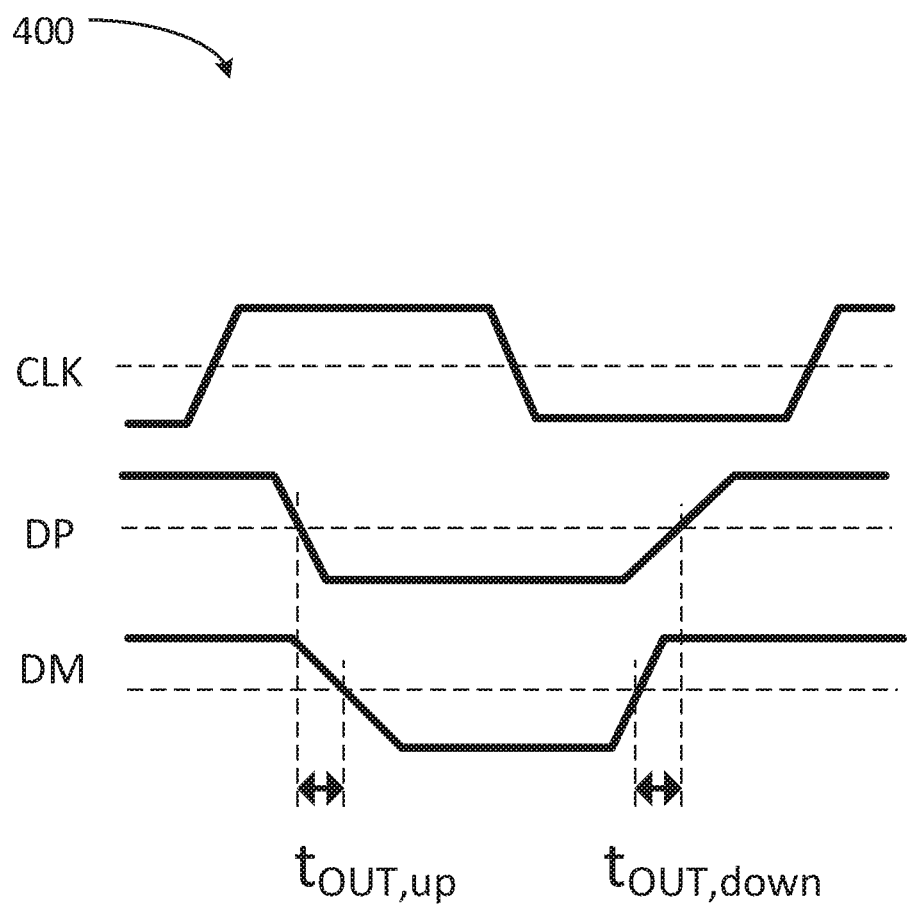
FIG. 4 illustrates a graph of exemplary waveforms associated with an exemplary double data rate comparator core incorporating aspects of the disclosed embodiments.

As illustrated in FIG. 3, in one embodiment a plus comparator core output OUTP of the comparator core 300 is produced by a CMOS inverter 314 coupled to the first node DM. A minus comparator core output OUTM of the comparator core 300 is produced by a second CMOS inverter 316 coupled to the second node DP. FIG. 4 illustrates exemplary signaling waveforms 400 associated with the comparator core 300. As shown in FIG. 4, a timing of the plus comparator core output OUTP and the minus comparator core output OUTM is proportional to a voltage difference between the plus input signal INP and the minus input signal INM. In the exemplary embodiment illustrated in FIG. 1 the plus and minus comparator core inputs INP, INM may for example be connected to plus $P_{IN}$ and minus $M_{IN}$ differential inputs 104 of comparator core 112, and similarly connected for all other comparator cores 110, 114.

Figure 5:
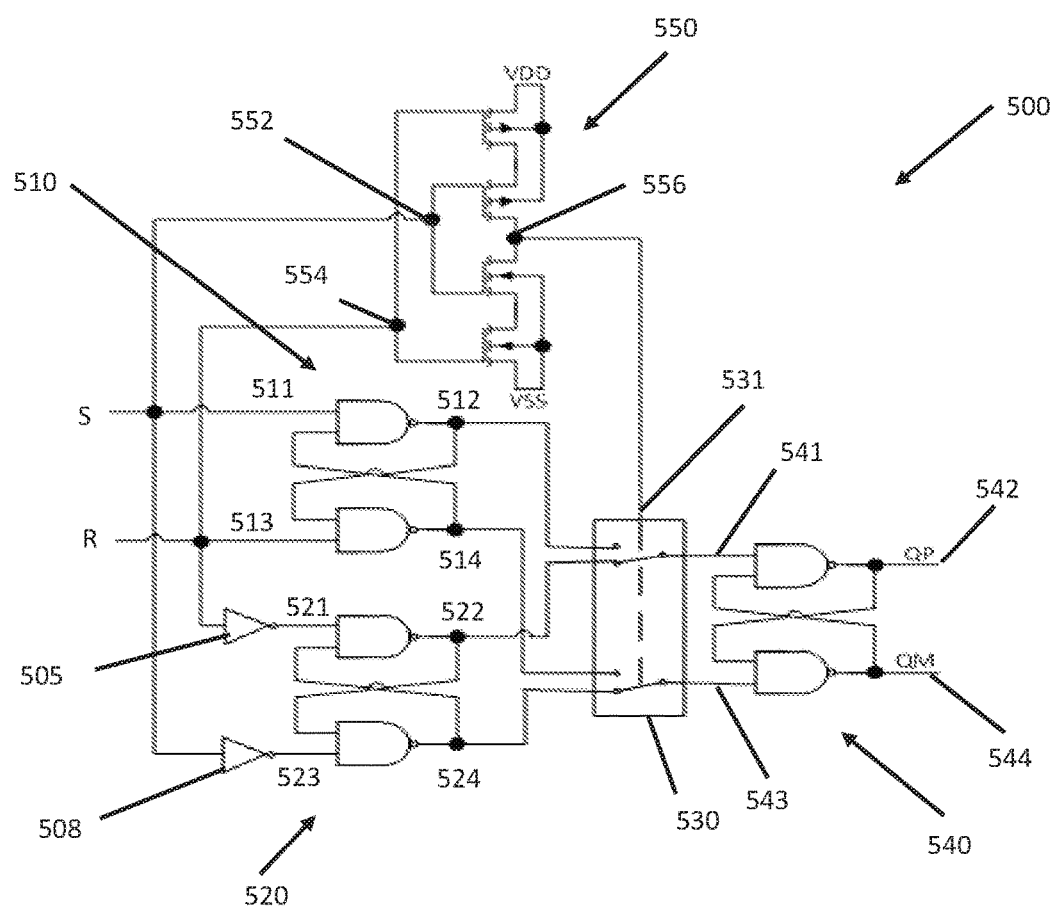
FIG. 5 illustrates a schematic diagram of an exemplary double data rate set-reset flip flop incorporating aspects of the disclosed embodiments.

FIG. 5 illustrates one embodiment of a clock-less set-reset flip flop 500 appropriate for use as any of the SR flip flops 120, 122, 124 illustrated in FIG. 1 above. In the schematic illustration of FIG. 5, a first SR latch circuit 510 is connected in parallel with a second SR latch circuit 520. In the example of FIG. 5, the first SR latch circuit 510 and the second SR latch circuit 520 comprise NAND-based SR flip-flops or latches. In alternate embodiments, the two latch circuits 510, 520 can comprise any suitable type of SR latch circuit.

In the example of FIG. 5, the first SR latch circuit 510 includes a set input 511 and a reset input 513. The set input 511 and a reset input 513 of the first SR latch circuit 510 are configured to be coupled to an output, such as $P_{N-1}$, $M_{N-1}$, of a double data rate comparator core 112. Alternatively, the set input 511 and a reset input 513 of the first SR latch circuit 510 may be coupled to an inverted output, such as $P_N$, $M_N$, of a double data rate comparator core 110, as illustrated by coupling of the SR flip flop 120 and comparator core 110 in FIG. 1. The first input 511 of the first SR latch circuit 510 is also connected to the set input node S of the set-reset circuit 500 and the second input 513 of the first SR latch circuit 510 is also connected to a reset input node R of the set-reset circuit 500.

The second SR latch circuit 520 includes set input 521 and a reset input 523. The set input 521 and the resent input 523 of the second SR latch circuit 520 are connected to inverted forms of the respective set input 511 and reset input 513 of the SR flip flop 500. As shown in FIG. 5, the first input 523 of the second SR latch circuit 520 is connected to an output of an inverter 508 connected between the set input node S and the first input 523. The second input 521 of the second SR latch circuit 520 is connected to an output of an inverter 505 connected between the reset input node R and the second input 521.

The two sets of latch circuits 510, 520 may follow the output of a comparator core circuit such as the comparator core 110 or the comparator core 300 illustrated above. Since the output produced by an SR flip-flop is unstable when both the set and reset signals are active, the set-reset flip flop 500 includes a switching unit or multiplexer 530. The switching unit 530 is configured to select the correct driving signal for the third, or output SR latch circuit 540. The switching device 530 is configured to selectively connect outputs 512, 514 of the first SR latch circuit 510 or outputs 522, 524 of the second SR latch circuit 520 to respective inputs 541, 543 of the third SR latch circuit 540. For example, in one embodiment, the switching device 530 is configured to selectively connect the first input 541 of the third SR latch circuit 540 and the second input 543 of the third SR latch circuit 540 to the respective first and second outputs 512, 514 of the first SR latch circuit 510 and the first and second outputs 522, 524 of the second SR latch circuit 520.

The switching unit 530 multiplexer is controlled by a controller 550. The controller 550 is configured to control the switching device 530 to switch between outputs 512, 514 and outputs 522, 524 when a state of a signal on the set input (S) and a state of a signal on the reset input (R) to the set-reset circuit 500 are equal.

In one embodiment, the controller 550 comprises a four-transistor circuit that includes two NMOS transistors and two PMOS transistors, usually referred as C-element. The C-element changes its output only when both S and R inputs are equal thus triggering the output SR flip-flop 540 with minimum delay. Therefore, the double data-rate set-reset flip flop 500 of the disclosed embodiments does not require a clock to choose the correct output.

In the example of FIG. 5, the controller 550 has a first input 552 connected to the set (S) input node of the set-reset flip flop 500, a second input 554 connected to the reset (R) node of the set-reset flip flop 500. The output 556 of the controller 550 is connected to a switching control input 531 of the switching device 530.

Thus, while there have been shown, described and pointed out, fundamental novel features of the disclosure as applied to the exemplary embodiments thereof, it will be understood that various omissions, substitutions and changes in the form and details of apparatus and methods illustrated, and in their operation, may be made by those skilled in the art without departing from the spirit and scope of the disclosure. Further, it is expressly intended that all combinations of those elements, which perform substantially the same function in substantially the same way to achieve the same results, are within the scope of the disclosure. Moreover, it should be recognized that structures and/or elements shown and/or described in connection with any disclosed form or embodiment of the disclosure may be incorporated in any other disclosed or described or suggested form or embodiment as a general matter of design choice. It is the intention, therefore, to be limited only as indicated by the scope of the claims appended hereto.

What is claimed is:
1. An apparatus comprising:
 a first double data rate comparator circuit configured to determine a relative voltage of a first differential input signal during each of a rising edge and a falling edge in a single clock cycle of a comparator clock input to the first double data rate comparator circuit;

a second double data rate comparator circuit configured to determine a relative voltage of a second differential input signal during each of the rising edge and the falling edge in the single clock cycle of the comparator clock input to the second double data rate comparator circuit;

a third double data rate comparator circuit configured to determine a relative voltage of a third differential input signal during each of a rising edge and a falling edge in the single clock cycle of an inverted comparator clock input to the third double data rate comparator circuit; and a first floating voltage reference circuit configured to shift a voltage of a differential comparator input signal by a first fixed amount, and produce the first differential input signal;

a second floating voltage reference circuit configured to shift the differential comparator input signal by a second fixed amount and produce the second differential input signal; and a clock inverter circuit connected to the comparator clock signal and configured to produce the inverted comparator clock signal;

wherein the third differential input signal is cross connected to the first differential input signal and the second differential input signal.

2. The apparatus of claim 1, further comprising:
a first double data rate set-reset flip flop circuit comprising a set input and a reset input configured to be connected to respective outputs of the first double data rate comparator circuit;

a second double data rate set-reset flip flop circuit comprising a set input and a reset input configured to be connected to respective outputs of the second double data rate comparator circuit; and a third double data rate set-reset flip flop circuit comprising a set input and a reset input configured to be connected to respective outputs of the third double data rate comparator circuit, wherein the first double data rate set-reset flip flop circuit, the second double data rate set-reset flip flop circuit and the third double data rate set-reset flip flop circuit are configured to perform a set-reset operation during the rising edge in the single clock cycle and the falling edge in the single clock cycle.

3. The apparatus according to claim 2, wherein at least one of the first double data rate set-reset flip flop circuit and the second double data rate set-reset flip flop circuit is coupled to a corresponding one of the first double data rate comparator circuit and the second double data rate comparator circuit through a respective one of a first pair of inverter circuits or a second pair of inverter circuits, wherein each one of the inverter circuit is configured to invert and delay a respective one of the outputs of the first double data rate comparator circuit and the outputs of the second double data rate comparator circuit, and wherein the delay of each one of the inverter circuits matches a delay of the clock inverter circuit.

4. The apparatus according to claim 2, wherein at least one of the first double data rate set-reset flip flop circuit, the second double data rate set-reset flip flop circuit, and the third double data rate set-reset flip flop circuit comprises:
a first set-reset (SR) latch circuit;
a second SR latch circuit configured to be connected in parallel with the first SR latch circuit;
a third SR latch circuit;

a switching device configured to selectively connect outputs of the first SR latch circuit or outputs of the second SR latch circuit to respective inputs of the third SR latch circuit; and a controller configured to control the switching device to switch between outputs of the first SR latch circuit and outputs of the second SR latch circuit when a state of a signal on the set input and a state of a signal on the reset input are equal.

5. The apparatus according to claim 4, wherein a set input and a reset input of the first SR latch circuit are configured to be connected through a pair of inverter circuits to the respective outputs of the first double data rate comparator circuit, and a set input and a reset input of the second SR latch circuit are configured to be connected to inverted forms of the respective set input and reset input of the first double data rate comparator circuit.

6. The apparatus according to claim 4, wherein:
a first input of the first SR latch circuit is configured to be connected to the set input of the first double data rate set-reset circuit;

a second input of the first SR latch circuit is configured to be connected to the reset input of the first double data rate set-reset circuit;

a first input of the second SR latch circuit is configured to be connected to an output of an inverter connected between the set input and the first input;

a second input of the second SR latch circuit is configured to be connected to an output of an inverter connected between the reset input and the second input; and the switching device is configured to selectively connect the first input of the third SR latch circuit and the second input of the third SR latch circuit to the respective first and second outputs of the first SR latch circuit and the first and second outputs of the second SR latch circuit.

7. The apparatus according to claim 4, wherein the controller has a first input configured to be connected to the set input of the first double data rate set-reset circuit, a second input configured to be connected to the reset input of the first double data rate set-reset circuit, and an output configured to be connected to a switching control input of the switching device.

8. The apparatus according to claim 1, wherein at least one of the first floating voltage reference circuit and the second floating voltage reference circuit comprises a switched capacitor network, the switched capacitor network comprising:
a first capacitor connected in series between an input and an output of the floating voltage reference circuit;
a second capacitor; and
a CMOS switching network configured to alternately connect the second capacitor to a reference voltage and in parallel to the first capacitor.

9. The apparatus according to claim 1, wherein at least one of the first double data rate comparator circuit, the second double data rate comparator circuit, and the third double data rate comparator circuit comprises a PMOS differential amplifier stage and an NMOS differential amplifier stage connected together in a push-pull configuration.

10. The apparatus according to claim 9, wherein:
prior to the rising edge in the single clock cycle, a voltage at a first node connecting a first drain of the PMOS differential amplifier stage to a first drain of the NMOS differential amplifier stage and a voltage at a second node connecting a second drain of the PMOS differential amplifier stage to a second drain of the NMOS differential amplifier stage is charged towards a positive supply voltage;

during the rising edge in the single clock cycle, the voltage at the first node and the voltage at the second node are discharged towards a negative supply voltage; and during the falling edge in the single clock cycle the voltage at the first node and the voltage at the second node are charged towards the positive supply voltage.

11. The apparatus according to claim 1, wherein at least one of the first double data rate comparator circuit, the second double data rate comparator circuit, and the third double data rate comparator circuit comprises a plus comparator circuit and a minus comparator circuit, wherein an output of the plus comparator circuit is produced by a CMOS inverter connected to a first node, and an output of the minus comparator circuit is produced by a second CMOS inverter connected to a second node, and wherein a timing of the output of the plus comparator circuit and the output of the minus comparator circuit is proportional to a voltage difference between an input signal and a reference signal of the at least one of the first double data rate comparator circuit, the second double data rate comparator circuit, and the third double data rate comparator circuit.

12. A radio receiver comprising:
a receiver circuit configured to receive a radio signal; and
an apparatus configured to process the radio signal, the apparatus comprising:
a first double data rate comparator circuit configured to determine a relative voltage of a first differential input signal during each of a rising edge and a falling edge in a single clock cycle of a comparator clock input to the first double data rate comparator circuit;
a second double data rate comparator circuit configured to determine a relative voltage of a second differential input signal during each of the rising edge and the falling edge in the single clock cycle of the comparator clock input to the second double data rate comparator circuit;
a third double data rate comparator circuit configured to determine a relative voltage of a third differential input signal during each of a rising edge and a falling edge in the single clock cycle of an inverted comparator clock input to the third double data rate comparator circuit; and
a first floating voltage reference circuit configured to shift a voltage of a differential comparator input signal by a first fixed amount, and produce the first differential input signal;
a second floating voltage reference circuit configured to shift the differential comparator input signal by a second fixed amount and produce the second differential input signal; and
a clock inverter circuit connected to the comparator clock signal and configured to produce the inverted comparator clock signal;
wherein the third differential input signal is cross connected to the first differential input signal and the second differential input signal.

13. The radio receiver according to claim 12, wherein the apparatus further comprises:
a first double data rate set-reset flip flop circuit comprising a set input and a reset input configured to be connected to respective outputs of the first double data rate comparator circuit;
a second double data rate set-reset flip flop circuit comprising a set input and a reset input configured to be connected to respective outputs of the second double data rate comparator circuit; and a third double data rate set-reset flip flop circuit comprising a set input and a reset input configured to be connected to respective outputs of the third double data rate comparator circuit,
wherein the first double data rate set-reset flip flop circuit, the second double data rate set-reset flip flop circuit and the third double data rate set-reset flip flop circuit are configured to perform a set-reset operation during the rising edge in the single clock cycle and the falling edge in the single clock cycle.

14. The radio receiver according to claim 13, wherein at least one of the first double data rate set-reset flip flop circuit, the second double data rate set-reset flip flop circuit, and the third double data rate set-reset flip flop circuit comprises:
a first set-reset (SR) latch circuit;
a second SR latch circuit configured to be connected in parallel with the first SR latch circuit;
a third SR latch circuit;
a switching device configured to selectively connect outputs of the first SR latch circuit or outputs of the second SR latch circuit to respective inputs of the third SR latch circuit; and
a controller configured to control the switching device to switch between outputs of the first SR latch circuit and outputs of the second SR latch circuit when a state of a signal on the set input and a state of a signal on the reset input are equal.

15. The radio receiver according to claim 14, wherein the controller has a first input configured to be connected to the set input of the first double data rate set-reset circuit, a second input configured to be connected to the reset input of the first double data rate set-reset circuit, and an output configured to be connected to a switching control input of the switching divice.

16. The radio receiver according to claim 12, wherein at least one of the first double data rate set-reset flip flop circuit and the second double data rate set-reset flip flop circuit is coupled to a corresponding one of the first double data rate comparator circuit and the second double data rate comparator circuit through a respective one of a first pair of inverter circuits or a second pair of inverter circuits,
wherein each one of the inverter circuit is configured to invert and delay a respective one of the outputs of the first double data rate comparator circuit and the outputs of the second double data rate comparator circuit, and wherein the delay of each one of the inverter circuits matches a delay of the clock inverter circuit.

17. The radio receiver according to claim 12, wherein at least one of the first floating voltage reference circuit and the second floating voltage reference circuit comprises a switched capacitor network, the switched capacitor network comprising:
a first capacitor connected in series between an input and an output of the floating voltage reference circuit;
a second capacitor; and
a CMOS switching network configured to alternately connect the second capacitor to a reference voltage and in parallel to the first capacitor.

18. The radio receiver according to claim 12, wherein at least one of the first double data rate comparator circuit, the second double data rate comparator circuit, and the third double data rate comparator circuit comprises a PMOS differential amplifier stage and an NMOS differential amplifier stage connected together in a push-pull configuration.

19. The radio receiver according to claim 18, wherein:
prior to the rising edge in the single clock cycle, a voltage at a first node connecting a first drain of the PMOS differential amplifier stage to a first drain of the NMOS differential amplifier stage and a voltage at a second node connecting a second drain of the PMOS differential amplifier stage to a second drain of the NMOS differential amplifier stage is charged towards a positive supply voltage;

during the rising edge in the single clock cycle, the voltage at the first node and the voltage at the second node are discharged towards a negative supply voltage; and during the falling edge in the single clock cycle the voltage at the first node and the voltage at the second node are charged towards the positive supply voltage.

20. The radio receiver according to claim 12, wherein at least one of the first double data rate comparator circuit, the second double data rate comparator circuit, and the third double data rate comparator circuit comprises a plus comparator circuit and a minus comparator circuit, wherein an output of the plus comparator circuit is produced by a CMOS inverter connected to a first node, and an output of the minus comparator circuit is produced by a second CMOS inverter connected to a second node, and wherein a timing of the output of the plus comparator circuit and the output of the minus comparator circuit is proportional to a voltage difference between an input signal and a reference signal of the at least one of the first double data rate comparator circuit, the second double data rate comparator circuit, and the third double data rate comparator circuit.

* * * * *

UNITED STATES PATENT AND TRADEMARK OFFICE
CERTIFICATE OF CORRECTION

PATENT NO.         : 10,461,763 B2
APPLICATION NO.    : 16/127871
DATED              : October 29, 2019
INVENTOR(S)        : Kimmo Koli Page 1 of 1

It is certified that error appears in the above-identified patent and that said Letters Patent is hereby corrected as shown below:

In the Claims

Claim 15, Column 14, Line 33: "the switching divice." should read -- the switching device. --.

Signed and Sealed this
Twenty-third Day of June, 2020

Andrei Iancu
*Director of the United States Patent and Trademark Office*